(12) United States Patent
Weichmann et al.

(10) Patent No.: US 8,831,060 B2
(45) Date of Patent: Sep. 9, 2014

(54) LASER

(75) Inventors: Ulrich Weichmann, Aachen (DE); Matthias Alexander Wilhelm Fechner, Hamburg (DE); Fabian Reichert, Ahrensburg (DE); Herbert Walter Klaus Petermann, Wedel (DE); Gunter Huber, Ellerbek (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/805,363

(22) PCT Filed: Jun. 10, 2011

(86) PCT No.: PCT/IB2011/052532
§ 371 (c)(1),
(2), (4) Date: Dec. 19, 2012

(87) PCT Pub. No.: WO2011/161580
PCT Pub. Date: Dec. 29, 2011

(65) Prior Publication Data
US 2013/0094533 A1 Apr. 18, 2013

(30) Foreign Application Priority Data

Jun. 22, 2010 (EP) .................................... 10166783

(51) Int. Cl.
*H01S 3/14* (2006.01)
*H01S 3/08* (2006.01)
(Continued)

(52) U.S. Cl.
CPC ................. *H01S 3/08* (2013.01); *H01S 3/0602* (2013.01); *H01S 3/091* (2013.01); *H01S 3/00* (2013.01); *H01S 3/0933* (2013.01); *H01S 3/09* (2013.01); *C09K 11/7718* (2013.01); *H01S 3/0941* (2013.01); *H01S 3/09415* (2013.01); *H01S 3/1603* (2013.01); *H01S 3/1668* (2013.01); *H01S 3/2391* (2013.01); *H01S 5/32341* (2013.01); *H04N 9/3161* (2013.01)

USPC ........ 372/39; 372/38.06; 372/41; 372/44.011; 372/69

(58) Field of Classification Search
CPC ........... H01S 3/00; H01S 3/0602; H01S 3/09; H01S 3/091; H01S 3/0933; H01S 3/1603
USPC ...................................... 372/38.06, 39, 41, 44
See application file for complete search history.

(56) References Cited

U.S. PATENT DOCUMENTS 4,233,570 A * 11/1980 Emmett et al. .................. 372/39
(Continued)

FOREIGN PATENT DOCUMENTS

WO 2007095228 A2 8/2007
WO 2010109365 A1 9/2010

OTHER PUBLICATIONS

Shimomura, Yasuo et al Photoluminescence and Crystal Structure of Green-Emitting Phosphor CaSc2O4:Ce3+, Journal of the Electrochemical Society, 2007, vol. 154, No. 8, Abstract Only.*
(Continued)

*Primary Examiner* — Dung Nguyen

(57) ABSTRACT

The invention relates to a laser (1) for emitting laser light in the visible spectral range. A rare earth doped anisotropic crystal (2) comprising a $5d$-$4f$ transition is arranged within a laser resonator (7, 8), and a pumping light source (3) pumps the crystal (2) for generating laser light in the visible spectral range by using the $5d$-$4f$ transition. The $5d$-$4f$ transition of the rare earth doped anisotropic crystal comprises an absorption band extending over several nm. Thus, pump light having a wavelength within a relatively broad wavelength range can be used. This reduces the requirements with respect to the wavelength accuracy of the pumping light source and, thus, more pumping light sources of an amount of produced pumping light sources can be used for assembling the laser, thereby reducing the amount of rejects.

13 Claims, 6 Drawing Sheets

(51) Int. Cl.
*C09K 11/77* (2006.01)
*H01S 3/16* (2006.01)
*H04N 9/31* (2006.01)
*H01S 3/06* (2006.01)
*H01S 3/091* (2006.01)
*H01S 3/00* (2006.01)
*H01S 3/0933* (2006.01)
*H01S 3/09* (2006.01)
*H01S 3/0941* (2006.01)
*H01S 3/23* (2006.01)
*H01S 5/323* (2006.01)

(56) References Cited

U.S. PATENT DOCUMENTS

| | | | |
|---|---|---|---|
| 6,212,213 | B1 | 4/2001 | Weber |
| 6,391,229 | B1* | 5/2002 | Watanabe et al. ............ 252/584 |
| 2009/0109517 | A1 | 4/2009 | Cho |
| 2012/0176549 | A1* | 7/2012 | Brown et al. ................ 348/725 |

OTHER PUBLICATIONS

Manivannan, V. et al "Nature of Luminescent Centers in Cerium-Activated Materials with the CaFe2O4 Structure", Journal of Luminsecence, vol. 102-103, May 1, 2003, pp. 635-637.*

Coutts, D.W. et al "Cerium-Doped Fluoride Lasers", IEEE Journal of Quantum Electronics, IEEE Service Certer, vol. 40, No. 10, Oct. 1, 2004, pp. 1430-1440.

Okada, F., et al "Solid-State Ultraviolet Tunable Laser: A CE3+ Doped LIYF4 Crystal", Journal of Applied Physics, vol. 75, No. 1, Jan. 1, 1994, pp. 49-53.

Kijima, N. "Phosphors for Solid-State Lighting" IDW. Proceedingsof the International Display Workshops, vol. 2, Jan. 1, 2006, pp. 1213-1216.

Gaume R. et al "Spectroscopic Properties of Yb-Doped Scandium Based Compounds Yb:CaSc2O4, YB: SrSc2O4 and yB: Sc2Si05", Optical Materials, Elsevier Science Publishers B.V., vol. 22, No. 2, Apr. 1, 2003, pp. 107-115.

Bellancourt, A. -R. et al "Blue Diode Pumped Solid-State Lasers for Digital Projection" Laser Physics, vol. 20, No. 3, Feb. 2, 2012, pp. 643-648.

Shimomura, Yasuo et al Photoluminescence and Crystal Structure of Green-Emitting Phosphor CaSc2O4:Ce3+, Journal of the Electrochemical Society, 2007, vol. 154, No. 8, Abstract Only.

Richter, A. et al "Diode Pumping of a Continuous-Wave Pr3+-doped LiYF4 Laser", Optics Letters, vol. 29, No. 22, Nov. 15, 2004, pp. 2638-2640.

* cited by examiner

LASER

FIELD OF THE INVENTION

The invention relates to a laser for emitting laser light in the visible spectral range. The invention relates further to a corresponding laser method and a lighting device comprising the laser.

BACKGROUND OF THE INVENTION

The article "Diode pumping of a continuous-wave Pr3+-doped LiYF4 laser" by A. Richter et al., Optics Letters, vol. 29, No. 22, pages 2638 to 2640, Nov. 15, 2004 discloses a laser comprising Pr:YLF as linear conversion material for converting blue light into green laser light with a wavelength of 523 nm. Pr:YLF has a narrow absorption band being smaller than 1 nm, and for pumping this linear conversion material blue pump light has to be used, which has a wavelength within this narrow absorption band. Pumping light sources can generally not be produced with such a high wavelength accuracy. Thus, after an amount of pumping light sources have been produced, it has to be checked which of these pumping light sources provide blue pump light within the narrow absorption band of Pr:YLF and these pumping light sources are then chosen for assembling the laser. Only a relatively small amount of the produced pumping light sources can therefore be used for assembling the laser.

SUMMARY OF THE INVENTION

It is an object of the present invention to provide a laser for emitting laser light in the visible spectral range, wherein the requirements for the wavelength accuracy of the pump light can be reduced. It is a further object of the present invention to provide a corresponding laser method and a lighting device, in particular, a laser projector, comprising the laser.

In a first aspect of the present invention a laser for emitting laser light in the visible spectral range is presented, wherein the laser comprises:
 a laser resonator,
 a rare earth doped anisotropic crystal comprising a $5d$-$4f$ transition, wherein the crystal is arranged within the laser resonator,
 a pumping light source for pumping the crystal by illuminating the crystal with pump light for generating laser light in the visible spectral range by using the $5d$-$4f$ transition.

The $5d$-$4f$ transition of the rare earth doped anisotropic crystal comprises an absorption band extending over several nm. Thus, pump light having a wavelength within a relatively broad wavelength range can be used. This reduces the requirements with respect to the wavelength accuracy of the pumping light source. For example, blue laser diodes comprising a wavelength being specified with an accuracy of about 10 nm may be used for pumping the rare earth doped anisotropic crystal comprising the $5d$-$4f$ transition.

The absorption band of the rare earth doped anisotropic crystal has preferentially a width of 5 nm or more, further preferred of 10 nm or more, even further preferred of 30 nm or more, and can also have a width of 50 nm or more.

The $5d$-$4f$ transition is preferentially a $4f^{n-1}5d^1$-$4f^n$ transition.

It is preferred that the crystal and the pumping light source are adapted such that the generated laser light is within a green wavelength range. A laser emitting in a green wavelength range can be used in several applications. For example, powerful blue and red semiconductor lasers are known, which can be used, for example, for digital projection purposes. If the crystal and the pumping light source are adapted such that the generated laser light is within a green wavelength range, the laser can form a RGB laser light source together with the powerful blue and red semiconductor lasers, which can be used, for example, for digital projection purposes.

It is further preferred that the crystal is adapted to comprise a specific indicatrix axis, wherein the sum of the cross section of the stimulated emission at a visible wavelength range on the $5d$-$4f$ transition of a rare earth doping element with respect to the specific indicatrix axis and the cross section of the excited state absorption at the same visible wavelength range with respect to the same specific indicatrix axis is positive, wherein the cross section of the stimulated emission is denoted with a positive sign and the cross section of the excited state absorption is denoted with a negative sign. The cross section of the stimulated emission of the $5d$-$4f$ transition and the excited state absorption with respect to an indicatrix axis are preferentially cross sections, wherein the electric field vector of the stimulated emitted light and/or the excited state absorbed light is parallel to the indicatrix axis. The cross section of the $5d$-$4f$ transition is preferentially the emission cross section of the $4f^{n-1}5d^1$-$4f^n$ transition, and the cross section of the excited state absorption is preferentially the cross section from the lowest $5d$ band, i.e. from the initial state, to other states than the $4f^n$ ground state.

It is further preferred that the laser resonator comprises a resonator axis, wherein the specific indicatrix axis is not parallel to the resonator axis. In particular, the specific indicatrix axis can be orthogonal to the resonator axis. By orienting the crystal with respect to the resonator axis such that the specific indicatrix axis is not parallel, in particular, orthogonal, to the resonator axis, a highly efficient laser can be provided, which generates laser light in the visible spectral range.

In an embodiment, the pump light illuminates the crystal in a pumping direction being not parallel, in particular, being orthogonal, to the resonator axis. Thus, the laser can be pumped transversely. However, in other embodiments, the laser can also be pumped longitudinally.

The pump light can be polarized. By using polarized pump light the laser efficiency can be improved. However, the laser can also be operated by using unpolarized pump light.

It is preferred that the crystal comprises an orthorhombic crystal structure. It is further preferred that the crystal comprises a crystal system denoted by the Schonflies notation "D2h". In an embodiment, the crystal comprises a crystal structure of the space group "P n m a (62)". The crystal has preferentially a crystal structure of the $CaFe_2O_4$ structure type. These crystal structures are anisotropic and can lead to a strong crystal field along at least one specific indicatrix axis of the crystal. The strong crystal field preferentially modifies the cross sections, in particular, increases the cross section of the $5d$-$4f$ transition and/or decreases the cross section of the excited state absorption of the crystal. This improves the laser efficiency.

It is further preferred that the crystal is doped with cerium. Moreover, the doping element can be incorporated in the crystal at a bivalent site, and the doping element incorporated in the crystal is preferentially trivalent. Incorporating the doping element, in particular, cerium, at a bivalent site reduces the probabilities of forming tetravalent cerium and of a charge-transfer transition. By incorporating the doping element, in particular, cerium, as a trivalent element, a relatively effective $5d$-$4f$ transition can be provided for generating laser light in the visible spectrum.

It is preferred that the crystal is $CaSc_2O_4$. This crystal comprises a relatively strong crystal field which can increase the cross section of the 5d-4f transition and/or decrease the cross section of an excited state absorption at least along one indicatrix axis of the crystal. This further increases the efficiency of the laser. It is also preferred that the crystal is produced by using a melt comprising 45 to 75 mole percentage of CaO, 25 to 55 mole percentage of $Sc_2O_3$ and 0 to 40 mole percentage of a doping element. The doping element is preferentially cerium. The $CaSc_2O_4$ crystal can be doped with, for example, up to 40 mole percentage of, for example, cerium.

It is preferred that the pumping light source is adapted to emit blue pump light. Preferentially, the blue pump light is in a wavelength range between 380 and 480 nm.

The blue pump light allows exciting the 4f-5d transition very efficiently, thereby further improving the efficiency of the laser. Moreover, if the laser is adapted for being used in a laser projector, a first part of the blue pump light may be used for pumping the crystal and a second part of the blue pump light may be used for projection purposes. Thus, the blue pump light may fulfill two functions, pumping the crystal and projecting information on a projection area.

In an aspect of the present invention a lighting device comprising the laser as defined in claim 1 is presented.

The lighting device preferentially comprises at least one further light source for generating further light being different to the laser light, wherein the lighting device is adapted to mix the laser light with the further light for generating mixed light.

The lighting device is preferentially a laser projector. The at least one further light source is preferentially adapted to emit red light. The mixed light can be white light, wherein the white light can be a mixture of green laser light, red laser light and blue laser light. The blue laser light can be a part of the pump light or light of a further light source.

In a further aspect of the present invention a laser method for emitting laser light in the visible spectral range is presented, wherein the laser method comprises:

providing a rare earth doped anisotropic crystal comprising a 5d-4f transition in a laser resonator, pumping the crystal by illuminating the crystal with pump light for generating laser light in the visible spectral range by using the 5d-4f transition.

It shall be understood that the laser of claim 1, the lighting device of claim 13, and the laser method of claim 15 have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
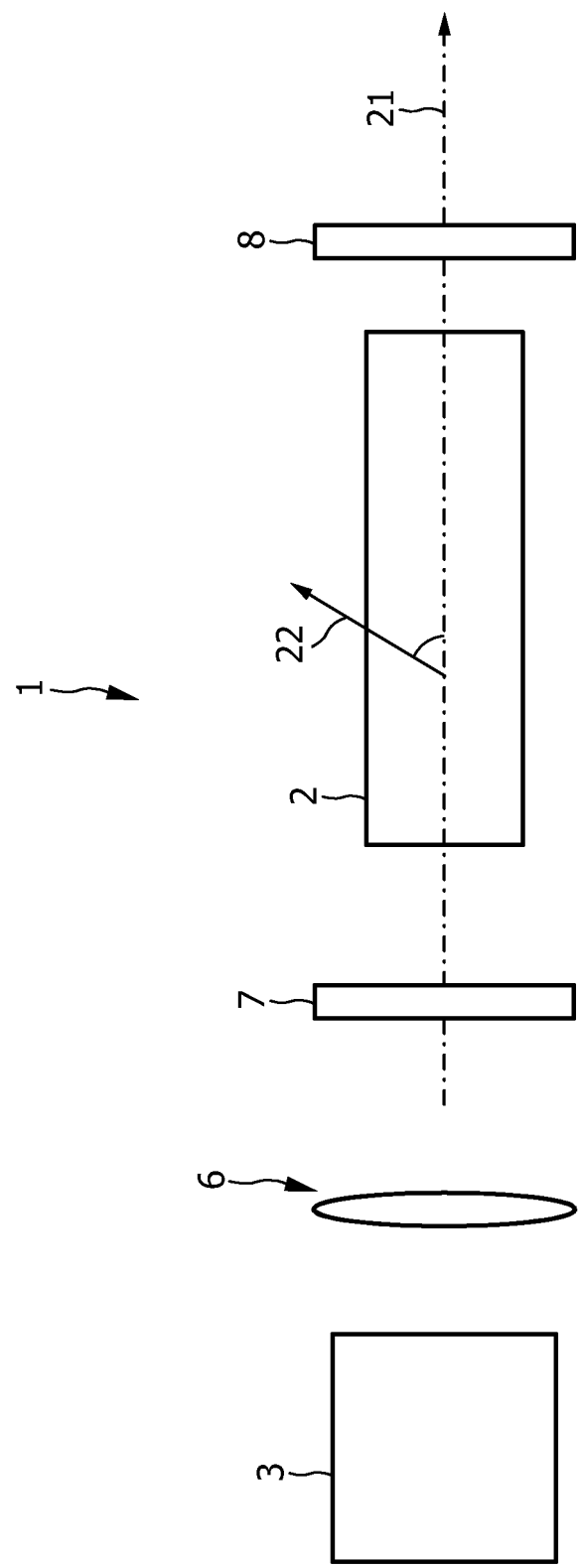
FIG. 1 shows schematically and exemplarily an embodiment of a laser for emitting laser light in the visible spectral range.

FIG. 1 shows schematically and exemplarily an embodiment of a laser for emitting laser light in the visible spectral range. The laser 1 comprises a rare earth doped anisotropic crystal 2 with a 5d-4f transition, and a pumping light source 3 for pumping the crystal 2 by illuminating the crystal 2 with pump light for generating laser light in the visible spectral range by using the 5d-4f transition. The pump light can be adapted for being coupled into the crystal 2 by using pump optics 6. The pump optics 6 can be optics, which are generally used for pumping a crystal and which, for example, collimate, shape and/or focus the pump light.

The crystal 2 is located between a resonator mirror 7 and an outcoupling mirror 8 for forming a resonator having a resonator axis 21. The resonator mirror 7 is highly transmissive to the pump light and highly reflective to the laser light, and the outcoupling mirror 8 is partially reflective to the laser light 4 for allowing a part of the laser light to leave the resonator.

The crystal 2 and the pumping light source 3 are configured such that the generated laser light is within a visible wavelength range, more preferentially within a green wavelength range. The crystal 2 has preferentially an orthorhombic crystal structure. It is further preferred that the crystal 2 comprises a crystal structure denoted by the Schonflies notation "D2h". In an embodiment, the crystal 2 comprises a crystal structure of the space group "P n m a (62)". It is also preferred that the crystal 2 comprises a crystal structure of the $CaFe_2O_4$ structure type. In this embodiment, the crystal 2 is $CaSc_2O_4$ doped with cerium. Cerium is preferentially trivalently incorporated at a bivalent site of the crystal 2.

The crystal 2 is adapted to comprise a specific indicatrix axis 22, wherein the sum of the cross section of the stimulated emission at the 5d-4f transition of cerium with respect to the specific indicatrix axis 22 and the cross section of the excited state absorption with respect to the same specific indicatrix axis 22 is positive. The cross section of the stimulated emission is denoted with the positive sign and the cross section of the excited state absorption is denoted with a negative sign. The crystal 2 is oriented with respect to the resonator axis 21 such that the specific indicatrix axis 22 is not parallel to the resonator axis 21. In an embodiment, the specific indicatrix axis 22 is orthogonal to the resonator axis 21.

The pumping light source 3 is adapted to emit blue pump light, in particular, blue pump light in a wavelength range between 380 and 480 nm. In this embodiment, the pumping light source 3 is an optically pumped semiconductor laser having a pump wavelength of 479,5 nm.

Figure 2:
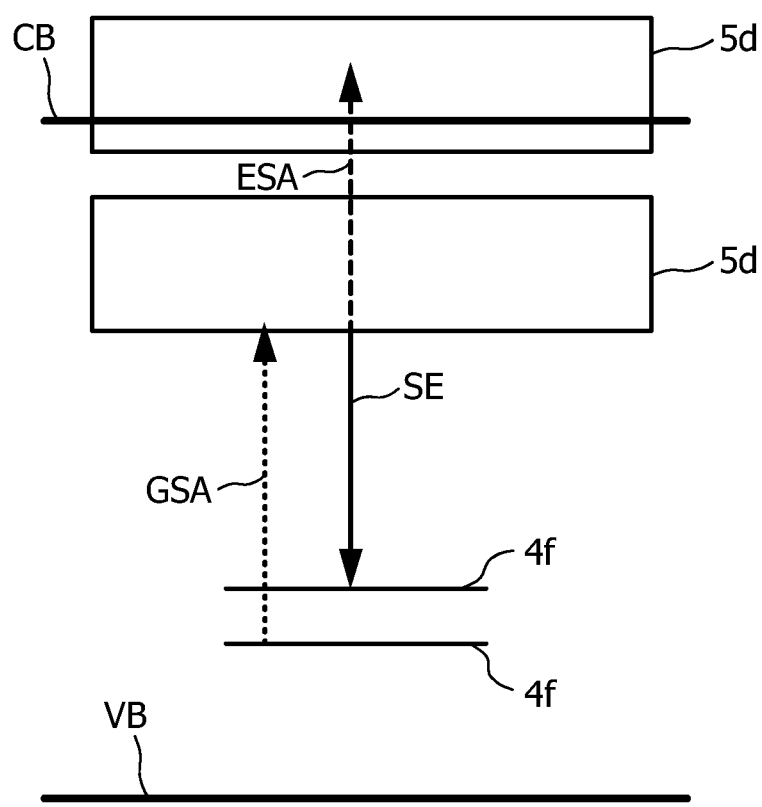
FIG. 2 shows schematically and exemplarily a term diagram of a cerium doped anisotropic crystal.

FIG. 2 shows schematically and exemplarily a term diagram of the crystal 2 doped with the trivalent cerium ($Ce^{3+}$). The term diagram shows the 4f energy levels of the cerium ion, the two lowest 5d energy levels, that are energetically broadened, the conduction band CB and the valence band VB. Moreover, the term diagram shows the ground state absorption (GSA), the stimulated emission (SE) which is used for generating the laser light in the visible spectral range, and the excited-state absorption (ESA).

By pumping the crystal 2 with the pump light, the lower 5d level is occupied. Since the crystal comprises the specific indicatrix axis 22, which is not parallel to the resonator axis 21, the cross section of the ESA is smaller than the cross section of the SE and laser light is efficiently generated.

Figure 3:
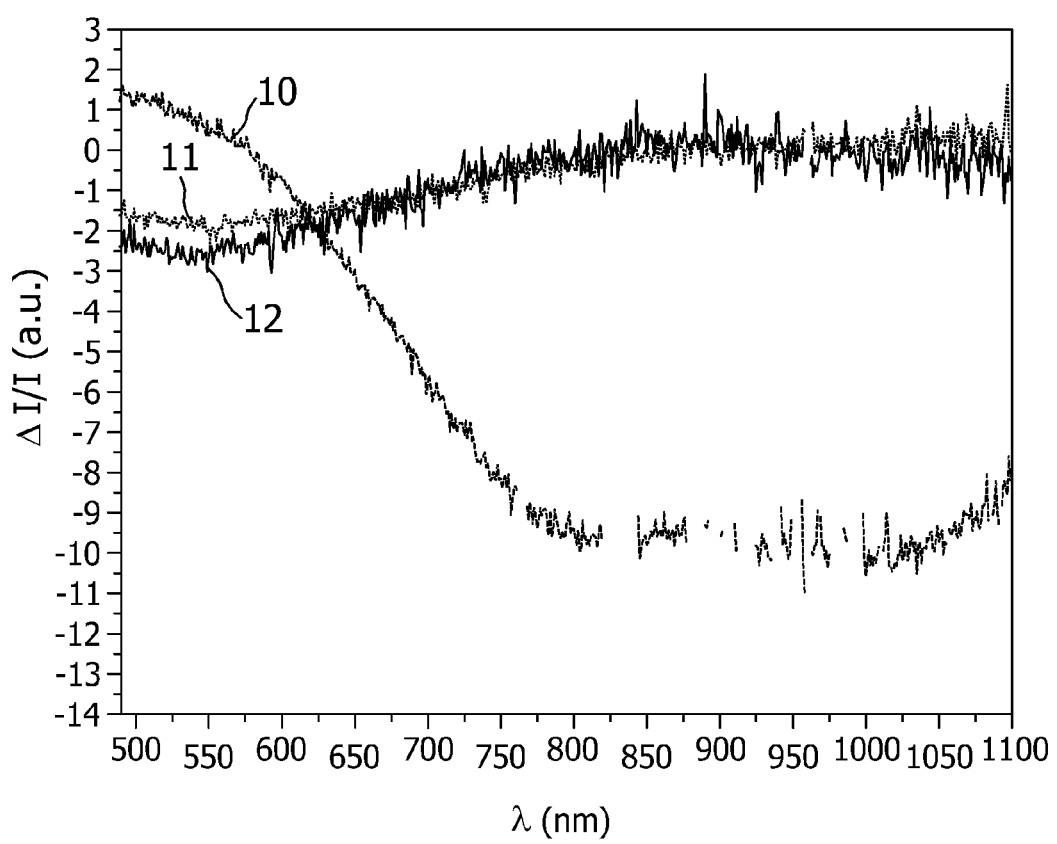
FIG. 3 shows exemplarily three difference spectra which are related to three indicatrix axes of the crystal.

FIG. 3 shows schematically and exemplarily normalized difference spectra 10, 11, 12 of the crystal 2. The spectra 10, 11, 12 are caused by stimulated emission at the 5$d$-4$f$ transition (positive values) and by excited-state absorption (negative values). The difference spectra 10, 11, 12 are determined by subtracting a spectrum measured, while the crystal 2 is not pumped, from a spectrum measured, while the crystal 2 is pumped, wherein the different spectra 10, 11, 12 relate to different indicatrix axes of the crystal.

The crystal 2 is pumped with a power of 270 mW by using an optically pumped semiconductor laser having a wavelength of 479.5 nm. Thus, the difference spectrum for a certain indicatrix axis is determined by calculating the difference between a first spectrum of light being polarized parallel to a certain indicatrix axis, which is measured while the crystal 2 is pumped by the optically pumped semiconductor laser, and a second spectrum of light being polarized parallel to the certain indicatrix axis, which is measured while the crystal 2 is not pumped by the optically pumped semiconductor laser. For measuring the absorption from the first excited state, i.e. from the lowest energy level of the 5$d$ band, light of a broadband emitting xenon lamp with a total power of 450 W is directed to the crystal 2 such that the pump light of the optically pumped semiconductor laser and the light of the xenon lamp illuminate the crystal 2 from opposite directions. Light having a wavelength being smaller than 475 nm is filtered out. It should be noted that the xenon lamp is of course only used for determining the spectra 10, 11, 12 and not for generating the laser light. The spectrum 10 has positive values in the wavelength range of about 490 to 580 nm. Thus, laser light, which is polarized parallel to the indicatrix axis which corresponds to the spectrum 10, can be generated in a wavelength range between 490 and 580 nm.

In the embodiment described above with reference to FIG. 1 the crystal 2 is longitudinally pumped. However, the crystal can also be pumped in another direction. For example, the crystal can be transversely pumped as schematically and exemplarily shown in FIG. 4.

Figure 4:
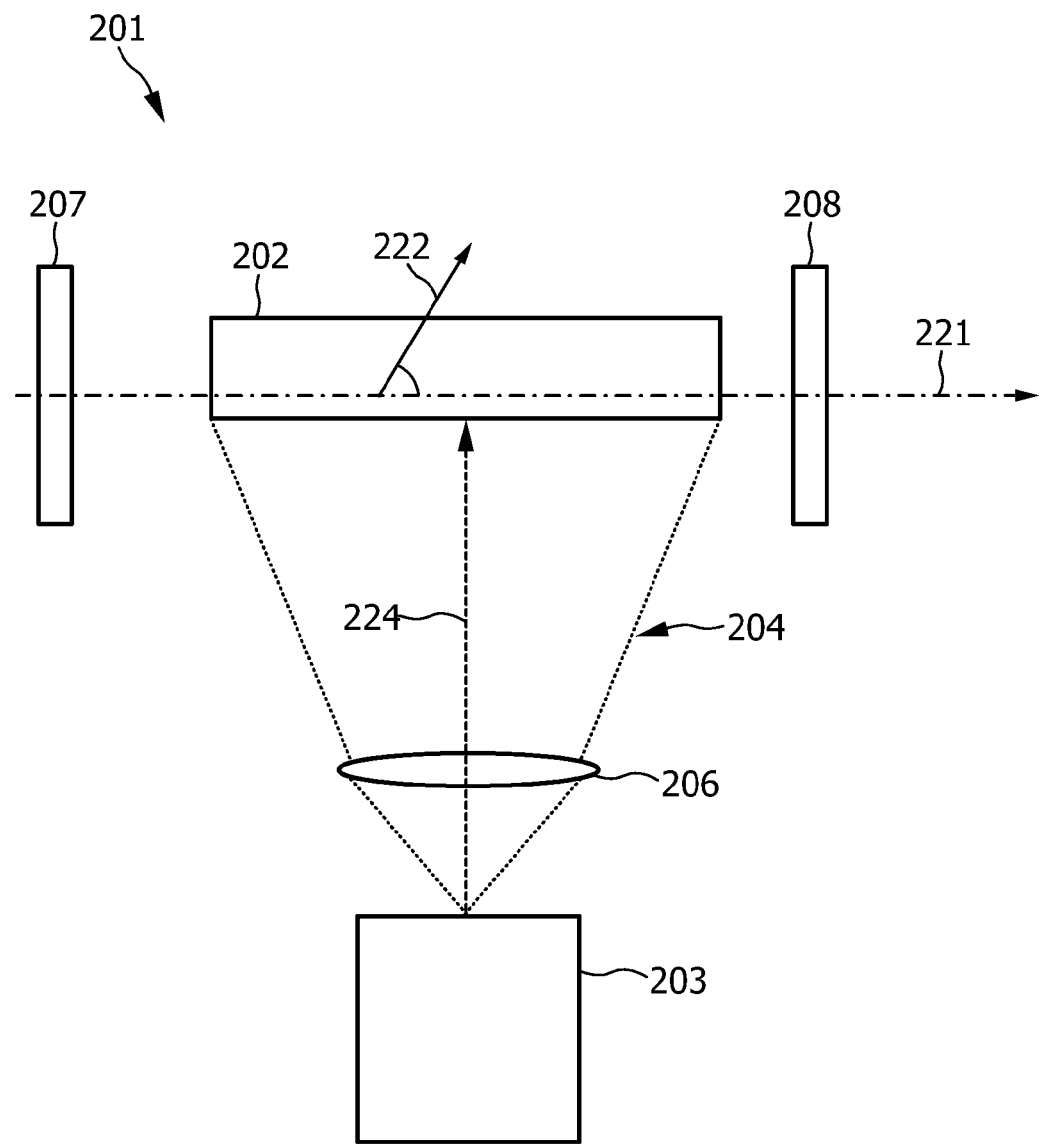
FIG. 4 shows schematically and exemplarily a further embodiment of a laser for emitting laser light in the visible spectral range.

The laser 201 shown in FIG. 4 comprises a rare earth doped anisotropic crystal 202 with a 5$d$-4$f$ transition, which can be similar to the crystal 2 described above with reference to FIG. 1. The laser 201 comprises a pumping light source 203 for pumping the crystal 202 by illuminating the crystal 202 with pump light 204 along a pump direction 224 for generating laser light in the visible spectral range by using the 5$d$-4$f$ transition. The pumping light source 203 can be similar to the pumping light source 3 described above with reference to FIG. 1.

The crystal 202 is located between a resonator mirror 207 and an outcoupling mirror 208 for forming a resonator having a resonator axis 221. The resonator mirror 207 is highly reflective to the laser light, and the outcoupling mirror 208 is partially reflective to the laser light for allowing a part of the laser light to leave the resonator. Also in this embodiment, the crystal 202 comprises a specific indicatrix axis 222, wherein the sum of the cross section of the stimulated emission at the 5$d$-4$f$ transition of the cerium with respect to the specific indicatrix axis 222 and the cross section of the excited state absorption with respect to the same specific indicatrix axis 222 is positive, wherein the cross section of the stimulated emission is denoted with a positive sign and the cross section of the excited state absorption is denoted with a negative sign.

The specific indicatrix axis 222 is not parallel and can be orthogonal to the resonator axis 221. The pump direction 224 is orthogonal to the resonator axis 221. The pump direction 224 can also enclose another angle with the resonator axis 221, for example, an angle of 45 degrees.

The laser 201 further comprises pump optics 206 for tailoring the pump light 204 in a known way, for example, for collimating, shaping and/or focusing the pump light 204.

The crystal 2 was grown by using the Czochralski method and by using a melt comprising CaO, $Sc_2O_3$, and cerium wherein 0.5 mole percentage of bivalent calcium ions were replaced by cerium ions in the melt.

Figure 5:
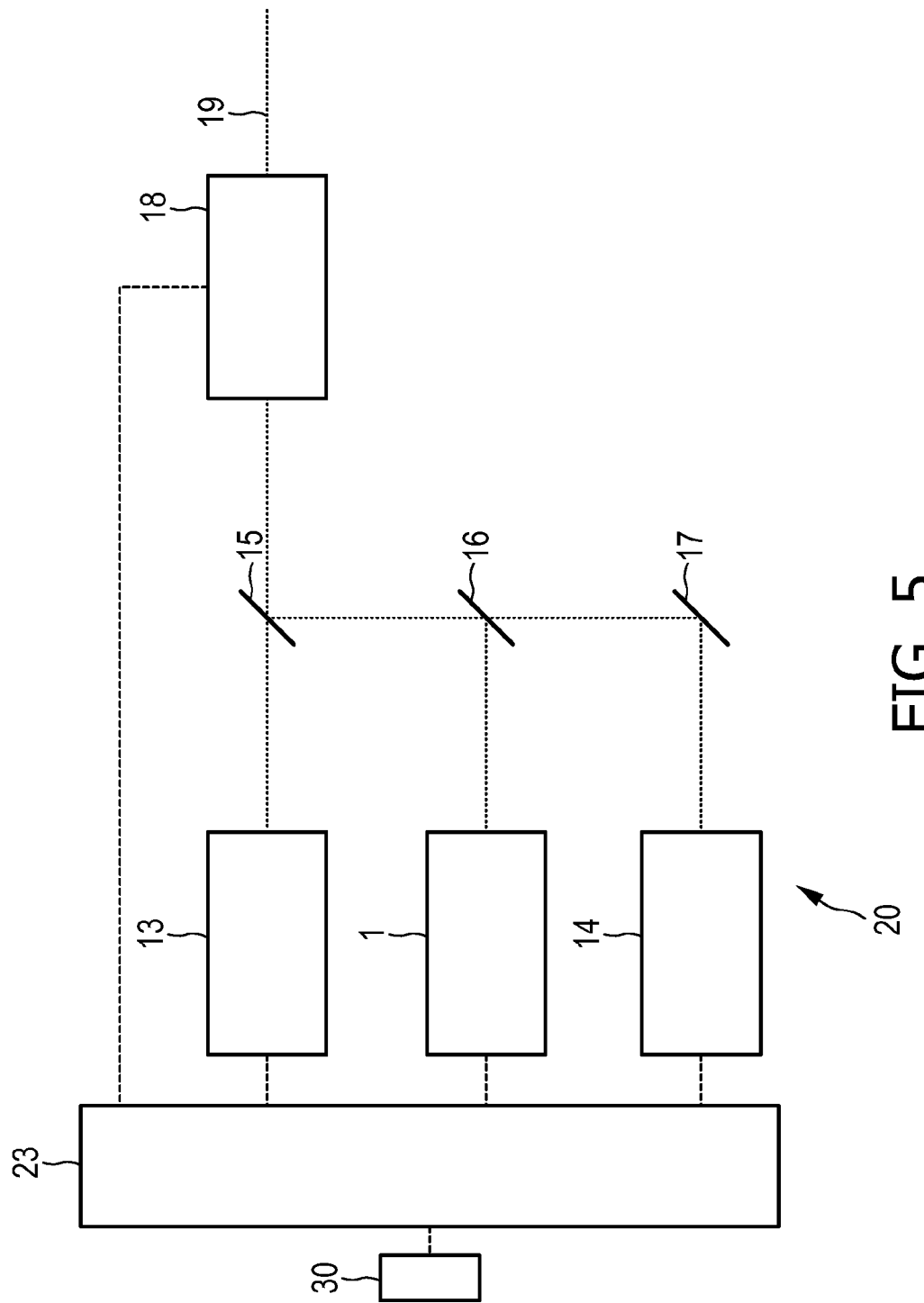
FIG. 5 shows schematically and exemplarily an embodiment of a lighting device.

FIG. 5 shows schematically and exemplarily an embodiment of a lighting device comprising the laser 1. The lighting device 20 is a laser projector comprising a first laser 13 for emitting blue light, a second laser 1 for emitting green light being the laser described above with reference to FIG. 1, and a third laser 14 for emitting red light.

The lighting device 20 further comprises a first mirror 15 being highly transmissive for blue light and highly reflective for green and red light, a second mirror 16 being highly transmissive for red light and highly reflective for green light, and a third mirror 17 being highly reflective for red light. The mirrors 15, 16, 17 are used for mixing the blue light, the green light and the red light emitted by the lasers 13, 1, 14. The mixed light is directed to an adjustable projection head 18 for generating projection laser light 19. The projection laser light 19 comprises information, which should be projected onto a projection area on, for example, a wall of a room, wherein the projection laser light 19 is directed onto the projection area for showing the information.

The lighting device 20 further comprises a control unit 23 for controlling the first laser 13, the second laser 1, the third laser 14 and the adjustable projection head 18, and an input unit 30 for allowing a user to input information which should be projected on the projection area. The input unit 30 is, for example, a video input unit like a DVD player, in which a data carrier comprising the video can be inserted. The controller 23 translates the video into control signals for modulating the intensity of the three lasers 13, 1 and 14 and for moving the projection laser light 19 such that it moves on the projection area for projecting the information on the projection area. The adjustable projection head comprises preferentially mirrors for moving the projection laser light 19 such that the information is shown on the projection area. The lighting device 20 uses therefore preferentially the flying spot technique. However, also other laser projection techniques can be used for projecting information on the projection area. For example, laser projection techniques which use DMD, LCD or LCoS elements can be applied. Moreover, also a transversely pumped laser like the laser described above with reference to FIG. 4 can be used as, for example, the green laser in the lighting device 20.

The lasers 13, 1, 14 emit preferentially in the blue (430 to 450 nm), green (510 to 550 nm) and red (610 to 650 nm) spectral region. The first laser 13, which emits blue light, and the third laser 14, which emits red light, are preferentially semiconductor lasers.

The intensity of the laser radiation of the first laser, the second laser and/or the third laser can be modulated by an external modulator or by modulating directly the output power of the lasers.

Figure 6:
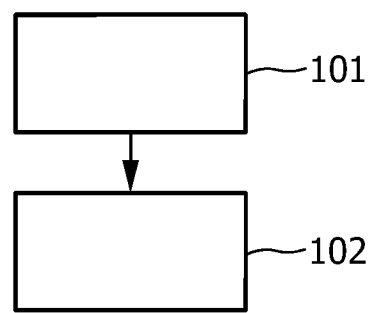
FIG. 6 shows a flowchart exemplarily illustrating an embodiment of a laser method for emitting laser light in the visible spectral range.

FIG. 6 shows a flowchart exemplarily illustrating an embodiment of a laser method for emitting laser light in the visible spectral range. In step 101, a rare earth doped anisotropic crystal 2 comprising a 5$d$-4$f$ transition is provided and, in step 102, the crystal 2 is pumped by illuminating the crystal 2 with pump light for generating laser light in the visible spectral range by using the 5$d$-4$f$ transition.

The laser 1 is preferentially based on the principle of linear frequency conversion of a blue light emitting laser diode being the pumping light source. In comparison to the generation of green laser light by using second-harmonic generation or upconversion this is a much simpler approach, because only linear absorption and emission processes contribute to the frequency conversion.

The above mentioned article by A. Richter et al. discloses a laser comprising Pr:YLF as linear conversion material for converting blue light into green laser light with the wavelength of 523 nm. However, Pr:YLF has, as already mentioned above, a relatively small absorption band, relatively small absorption coefficients, a relatively small emission band and a relatively large settling time. In contrast, the crystals, which are used by the lasers described above with reference to FIGS. 1 and 4, comprise preferentially a larger absorption band, larger absorption coefficients, a larger emission band, and a smaller settling time.

The laser transition in the Pr:YLF-laser is a parity forbidden $4f$ intraband transition. In order to obtain larger cross sections which decrease the settling time, the lasers 1 and 201 use preferentially a parity allowed $5d$-$4f$ transition in a strong crystal field caused by the asymmetrically distributed oxygen ions around the doping element of the crystal. Moreover, the anisotropy leads to a laser amplification at the $5d$-$4f$ transition in the visible spectral region, wherein the ESA of the doping element, in particular, of the cerium ion, depends on the polarization of the laser light and wherein photons within the green spectral region are amplified at least along one of the crystallographic axes. In some crystals cerium emits in the ultraviolet spectral region. However, by using a crystal having a relatively strong crystal field emission in the visible spectral region is obtained. As an example for such an anisotropic cerium doped crystal with a strong crystal field $Ce^{3+}$: $CaSc_2O_4$ is a suitable material.

Because of the relatively large absorption of the crystal, it can be transversely pumped by the pump light of the pumping light source. Moreover, because of the broad emission band the laser can be adapted such that the emission wavelength of the laser may be varied. This may be useful in spectroscopic applications.

It is preferred that the cerium ions are incorporated at a bivalent site, in order to prevent forming tetravalent cerium and to decrease the probability of a charge-transfer transition. However, cerium may also be incorporated into the anisotropic crystal at a trivalent site.

Although in the above described embodiment the doped crystal is $CaSc_2O_4$, in other embodiments other anisotropic crystals which are doped with a doping element can be used for generating laser light in the visible spectral region by using the $5d$-$4f$ transition. For example, other doped oxides can be used as doped anisotropic crystal wherein the doped oxides may be doped with cerium or another doping element. Oxygen ions have, in comparison to, for example, fluorine or chlorine, a relatively high polarizability and covalency. Because of this relatively high polarizabilty and covalency the centroid shift of the $5d$ band present in the anisotropic crystal can move the $5d$-$4f$ transition from an ultraviolet spectral region into the visible spectral region.

It is further preferred that the anisotropic crystal comprises oxygen ions which are asymmetrically distributed around the doping element, in particular, around the cerium ion, i.e. asymmetrical lattice sites are preferred for the doping element. The asymmetric distribution of the oxygen ions can generate a crystal field being strong enough for broadening the $5d$ bands, which can also lead to a movement of the $5d$-$4f$ transition from an ultraviolet spectral region to the visible spectral region. For example, the asymmetric distribution of the oxygen ions can form a deformed cube or a tetraeder, in order to generate a crystal field which allows the laser to generate laser light in the visible spectral region.

Instead of using a $CaSc_2O_4$ crystal another anisotropic doped crystal can be used for generating laser light in the visible spectral region. For example, another doped anisotropic crystal having a $CaFe_2O_4$ structure like $CaY_1Sc_1O_4$ can be used.

Although in an above described embodiment an optically pumped semiconductor laser having a wavelength of 479.5 nm has been used as pumping light source, in other embodiments other pumping light sources can be used, for example, semiconductor laser diodes emitting at a wavelength of, for example, 405 nm or 450 nm.

Although in the embodiment described above with reference to FIG. 5 the laser is used within a laser projector, the laser can also be used in other lighting devices like a fiber-optical illumination unit, a spot-light, et cetera.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention relates to a laser for emitting laser light in the visible spectral range. A rare earth doped anisotropic crystal comprising a $5d$-$4f$ transition is arranged within a laser resonator, and a pumping light source pumps the crystal for generating laser light in the visible spectral range by using the $5d$-$4f$ transition. The $5d$-$4f$ transition of the rare earth doped anisotropic crystal comprises an absorption band extending over several nm. Thus, pump light having a wavelength within a relatively broad wavelength range can be used. This reduces the requirements with respect to the wavelength accuracy of the pumping light source and, thus, more pumping light sources of an amount of produced pumping light sources can be used for assembling the laser, thereby reducing the amount of rejects.

The invention claimed is:

1. A laser for emitting laser light in the visible spectral range, the laser comprising:
   a laser resonator, characterized by
   a rare earth doped anisotropic crystal comprising a $5d$-$4f$ transition, wherein the crystal is arranged within the laser resonator,
   a pumping light source for pumping the crystal by illuminating the crystal with pump light for generating laser light in the visible spectral range by using the $5d$-$4f$ transition,
   wherein the crystal is adapted to comprise a specific indicatrix axis, wherein the sum of the cross section of the stimulated emission at a visible wavelength range on the $5d$-$4f$ transition of a rare earth doping element with respect to the specific indicatrix axis and the cross section of the excited state absorption at the same visible wavelength range with respect to the same specific indicatrix axis is positive, wherein the cross section of the stimulated emission is denoted with a positive sign and the cross section of the excited state absorption is denoted with a negative sign.

2. The laser as defined in claim 1, wherein the crystal and the pumping light source are adapted such that the generated laser light is within a green wavelength range.

3. The laser as defined in claim 1, wherein the laser resonator comprises a resonator axis and wherein the specific indicatrix axis is not parallel to the resonator axis.

4. The laser as defined in claim 3, wherein the specific indicatrix axis is orthogonal to the resonator axis.

5. The laser as defined in claim 1, wherein the crystal comprises an orthorhombic crystal structure.

6. The laser as defined in claim 1, wherein the crystal has a crystal structure of the $CaFe_2O_4$ structure type.

7. The laser as defined in claim 1, wherein the crystal is doped with cerium.

8. The laser as defined in claim 1, wherein a doping element is incorporated in the crystal at a bivalent site.

9. The laser as defined in claim 1, wherein a doping element incorporated in the crystal is trivalent.

10. The laser as defined in claim 1, wherein the crystal is $CaSc_2O_4$.

11. A lighting device characterized in that the lighting device compriese the laser as defined in claim 1.

12. The lighting device as defined in claim 11, wherein the lighting device comprises at least one further light source for generating further light being different to the laser light, wherein the lighting device is adapted to mix the laser light with the further light for generating mixed light.

13. A laser method for emitting laser light in the visible spectral range, characterized in that the laser method comprises:

providing a rare earth doped anisotropic crystal comprising a $5d4f$ transition in a laser resonator, pumping the crystal by illuminating the crystal with pump light for generating laser light in the visible spectral range by using the $5d$-$4f$ transition, wherein the crystal is adapted to comprise a specific indicatrix axis, wherein the sum of the cross section of the stimulated emission at a visible wavelength range on the $5d$-$4f$ transition of a rare earth doping element with respect to the specific indicatrix axis and the cross section of the excited state absorption at the same visible wavelength range with respect to the same specific indicatrix axis is positive, wherein the cross section of the stimulated emission is denoted with a positive sign and the cross section of the excited state absorption is denoted with a negative sign.

* * * * *